United States Patent [19]

Chiou

[11] Patent Number: 5,519,575
[45] Date of Patent: May 21, 1996

[54] CPU COOLING FAN MOUNTING STRUCTURE

[76] Inventor: Ming D. Chiou, 3F., No. 4, Alley 11, Lane 327, Chung Shan Rd., Chung Ho City, Taipei, Taiwan

[21] Appl. No.: 388,936

[22] Filed: Feb. 14, 1995

[51] Int. Cl.⁶ ........................................... H05K 7/20
[52] U.S. Cl. ................... 361/697; 165/80.3; 165/122; 165/185; 257/722; 417/177
[58] Field of Search ................... 165/80.2, 80.3, 165/122–126, 185; 174/16.3; 257/722; 361/694–697; 417/176–178, 208.3, 211.1, 213.1, 214.1, 220

[56] References Cited

U.S. PATENT DOCUMENTS

| | | | |
|---|---|---|---|
| 5,288,203 | 2/1994 | Thumar | 361/694 |
| 5,377,745 | 1/1995 | Hsieh | 165/80.3 |
| 5,409,352 | 4/1995 | Lin | 415/177 |

Primary Examiner—Gregory D. Thompson
Attorney, Agent, or Firm—Pro-Techtor International

[57] ABSTRACT

A CPU cooling fan mounting structure including a motor-driven cooling fan, a heat-resisting plastic mount, and a heat sink fixed to the CPU. The heat sink having a mounting hole, which receives the heat-resisting plastic mount. The heat-resisting plastic mount fitting the mounting hole and being coupled to one end of the motor-driven cooling fan. The size of the heat-resisting plastic mount being slightly bigger than the mounting hole so that the heat-resisting plastic mount is firmly retained to the base plate of the heat sink when it is fitted into the mounting hole.

3 Claims, 6 Drawing Sheets

CPU COOLING FAN MOUNTING STRUCTURE

BACKGROUND OF THE INVENTION

The present invention relates to a CPU cooling fan mounting structure which ensures stable operation of the CPU cooling fan.

In order to improve the heat dissipating efficiency of a CPU heat sink, a cooling fan is commonly used and installed in the CPU heat sink. As illustrated in FIG. 1, the heat sink 101 has a flat base 1011, an axle hole 1013 at the center of the flat base 1011, and a plurality of upright radiating fins 1012 raised around the four sides of the flat base 1011; the cooling fan 102 is mounted on the flat base 1011 of the heat sink 101. The fan motor 103 of the cooling fan 102 has a shaft 1032 extended out of the PC board 1031 and fitted into the axle hole 1013 on the flat base 1011 of the heat sink 101. When operated, the cooling fan draw cooling air from the top side into the heat sink and then driven it out of the heat sink 101 radially to carry heat away. As the heat sink 101 is made from aluminum alloy and the shaft 1032 of the fan motor 103 is made from steel, they have different coefficients of expansion. Therefore, the diameter of the axle hole 1013 will become slightly bigger when hot, causing the shaft 1032 of the fan motor 103 to oscillate in the axle hole 1013. When the shaft 1032 of the fan motor 103 oscillates in the axle hole 1013 during the operation of the cooling fan 102, noises will be produced. Frequently vibrating the shaft 1032 of the fan motor 103 will damage the periphery of the axle hole 1013, causing the diameter of the axle hole 1013 enlarged. When the diameter of the axle hole 1013 is enlarged permanently, the fan motor 103 of the cooling fan 102 may disconnect from the heat sink 101 easily.

SUMMARY OF THE INVENTION

The present invention has been accomplished to provide a CPU cooling fan mounting structure which eliminates the aforesaid problem.

According to one aspect of the present invention, the CPU cooling fan mounting structure comprises a motor-driven cooling fan, a heat-resisting plastic mount, and a heat sink fixed to the CPU, wherein the heat sink has a mounting hole, which receives the heat-resisting plastic mount; the heat-resisting plastic mount fits the mounting hole and is coupled to one end of the motor-driven cooling fan, the size of the heat-resisting plastic mount being slightly bigger than the mounting hole so that the heat-resisting plastic mount is firmly retained to the base plate of the heat sink when it is fitted into the mounting hole. Because the cooling fan is supported on the heat-resisting plastic mount, which provides a broad bearing surface, which receives the front end Of the cooling fan, the cooling fan does not oscillate during its Operation. When the mounting hole on the flat base of the heat sink is expanded because of hot, the heat-resisting plastic mount is relatively released and maintained firmly retained to the mounting hole. Therefore, the cooling fan does not displace when operated under a high temperature environment. Another advantage of the present invention is that the heat-resisting plastic mount absorbs shocks from the cooling fan during its operation, therefore little noise is-produced during the operation of the cooling fan. Because the heat-resisting plastic mount is fixed to the cooling fan before its installation in the heat sink, the cooling fan can be conveniently fastened to the heat sink simply by fitting the heat-resisting plastic mount into the mounting hole on the flat base of the heat sink. Furthermore, because the heat-resisting plastic mount can be conveniently attached to and disconnected from the heat sink, the replacement of the cooling fan is easy.

DETAILED DESCRIPTION OF THE PREFERRED EMBODIMENTS

Figure 1:
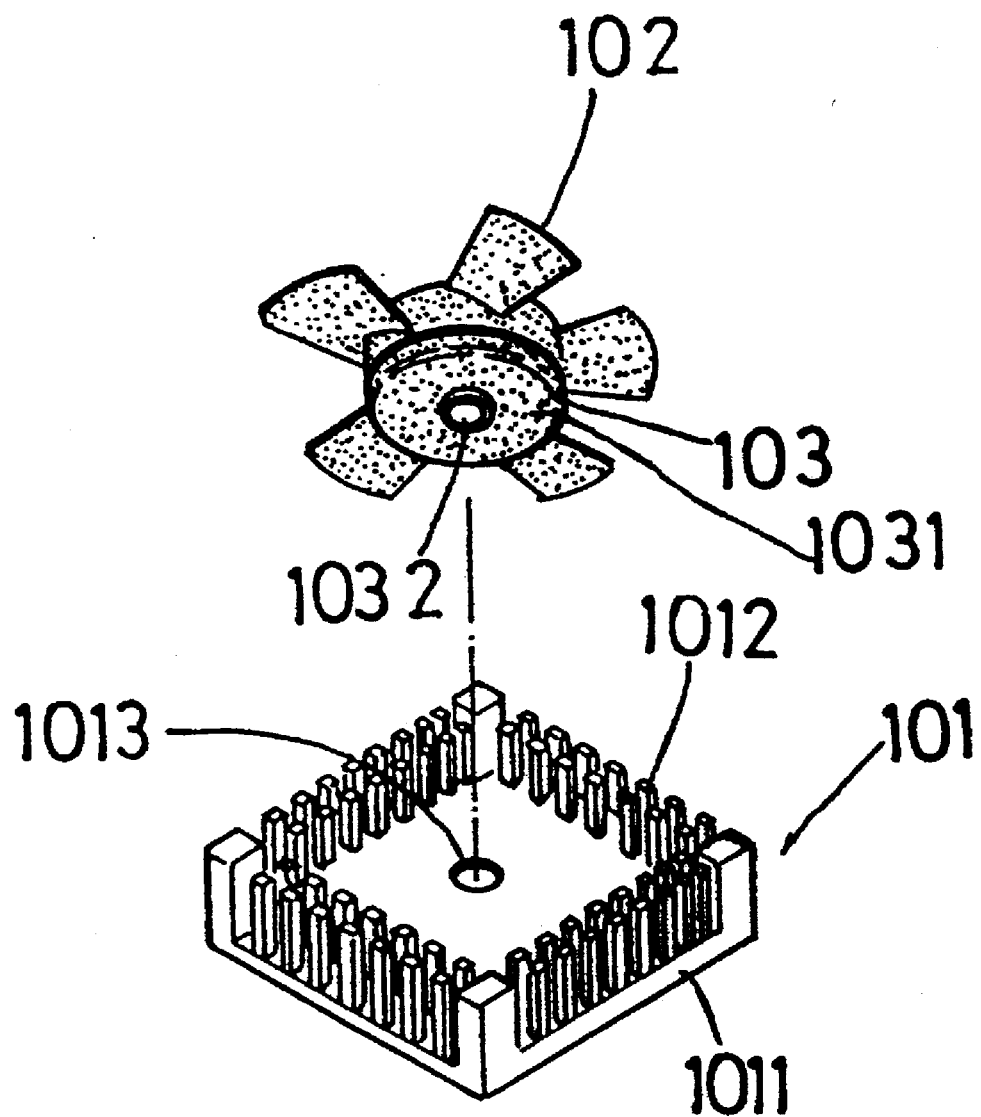
FIG. 1 is an exploded view of a CPU cooling fan mounting structure according to the prior art.
Figure 2:
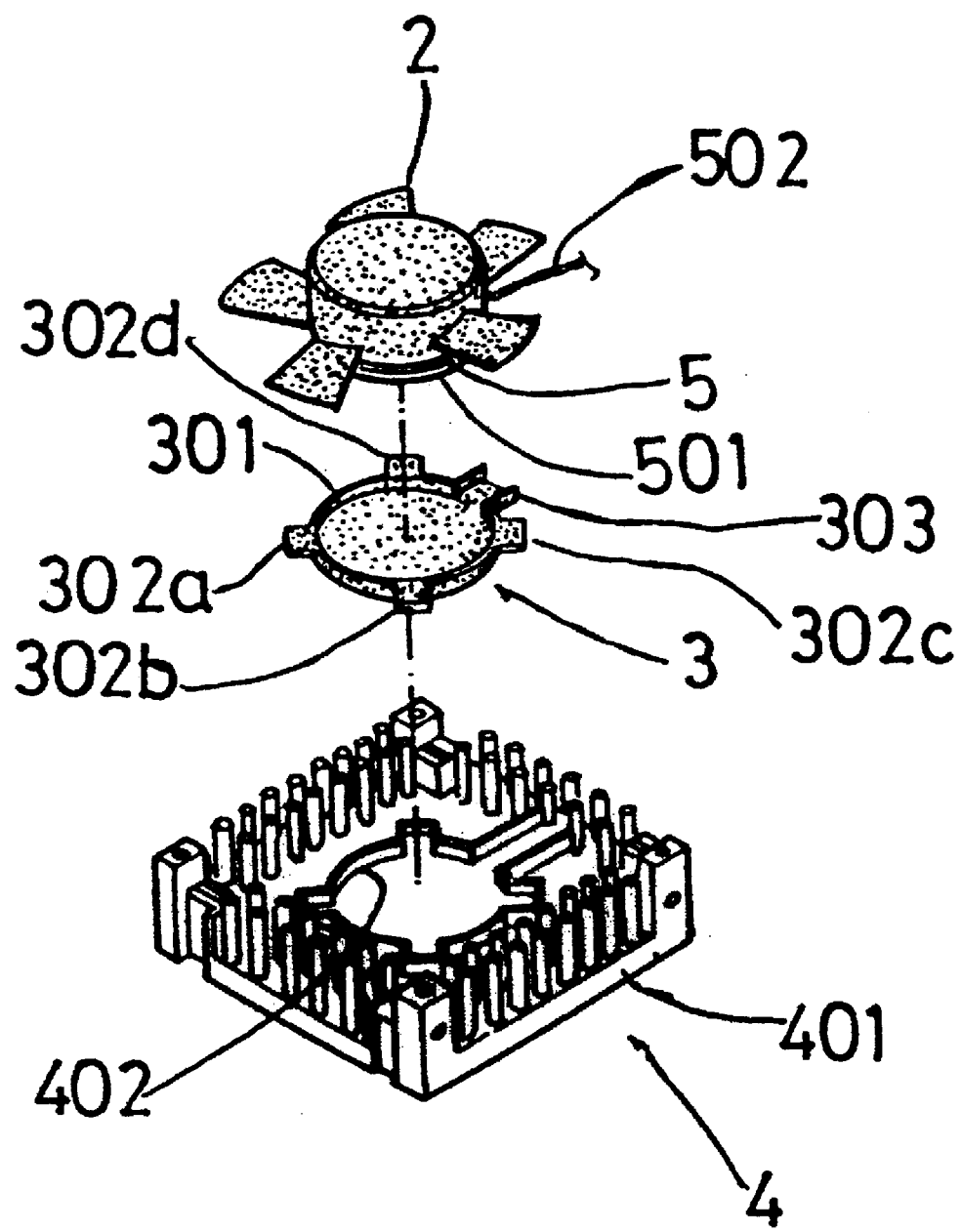
FIG. 2 is an exploded view of a CPU cooling fan mounting structure according to the present invention.
Figure 3:
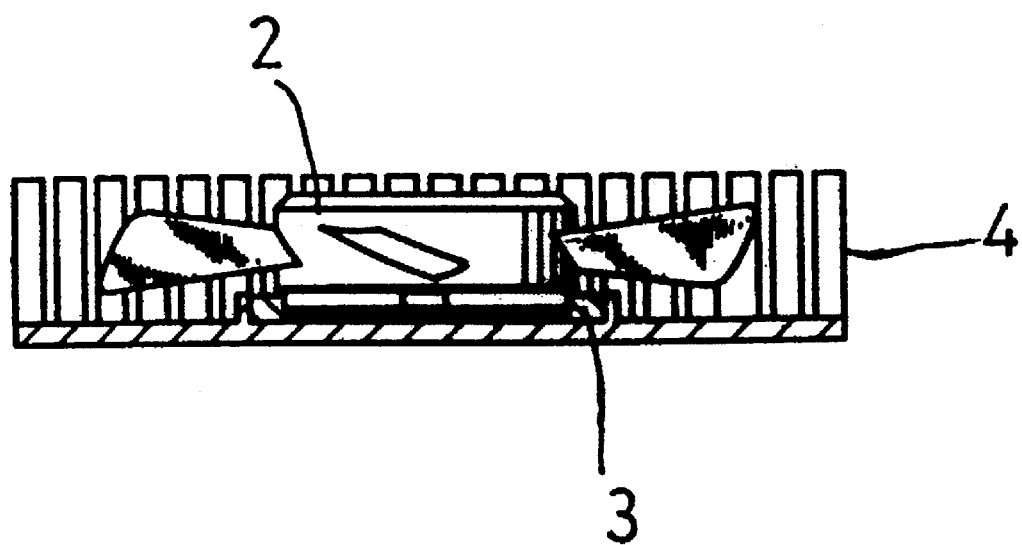
FIG. 3 is a front side view in section of the CPU cooling fan mounting structure shown in FIG. 2 when assembled.
Figure 6:
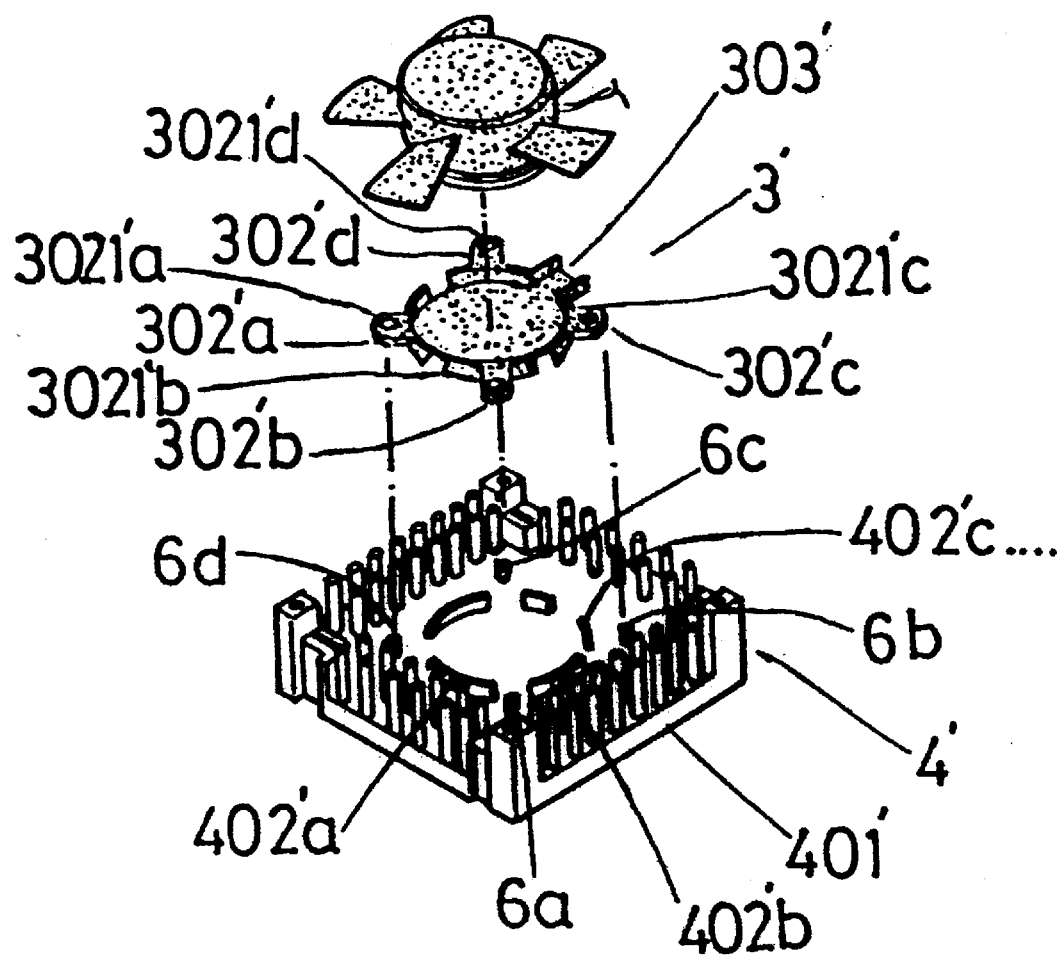
FIG. 6 is an exploded view of an alternate form of the CPU cooling fan mounting structure with a flange formed from multiple segments.

Referring to FIGS. 2, 3 and 6, a CPU cooling fan mounting structure according to one embodiment of the present invention is shown comprised of a cooling fan 2, a heat-resisting plastic mount 3, and a heat sink 4. The heat-resisting plastic mount 3 is shaped like a dish having a flange 301 around the border, which receives the PC board 501, which is attached to the outer side of the fan motor 5 of the cooling fan 2. The maximum height of the heat-resisting plastic mount 3 is approximately equal to the thickness of the flat base 401 of the heat sink 4. The flange 301 can be an endless flange, or formed of a plurality of flange segments. The heat-resisting plastic mount 3 further comprises a plurality of outward lugs 302a, 302b, 302c, and 302d radially extended from the flange 301, and a wire groove 303 through the flange 301. The flat base 401 of the heat sink 4 has a mounting hole 402 at the center, which receives the heat-resisting plastic mount 3. The mounting-hole 402 is made of shape corresponding to the heat-resisting plastic mount 3 but in size slightly smaller than the heat-resisting plastic mount 3. Therefore, when the heat-resisting plastic mount 3 fits into the mounting hole 402, it becomes firmly retained to the flat base 401 of the heat sink 4. Before the installation of the cooling fan 2 in the heat sink 4, an adhesive glue is covered on the PC board 501, and then the cooling fan 2 is mounted within the heat sink 4 by attaching the PC board 501 to the heat-resisting plastic mount 3 within the flange 301, permitting the electric wire 502 of the cooling fan 2 to be extended out of the wire groove 303.

Figure 4:
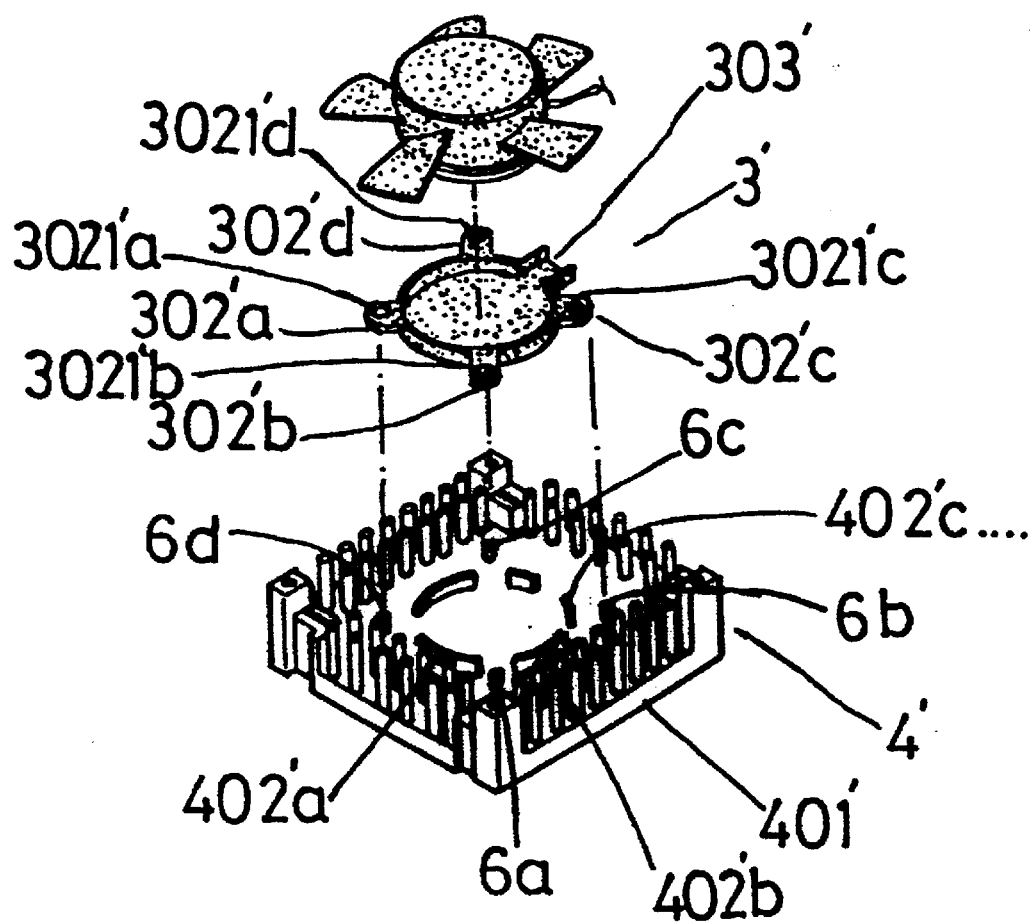
FIG. 4 is an exploded view of an alternate form of the CPU cooling fan mounting structure of the present invention.
Figure 5:
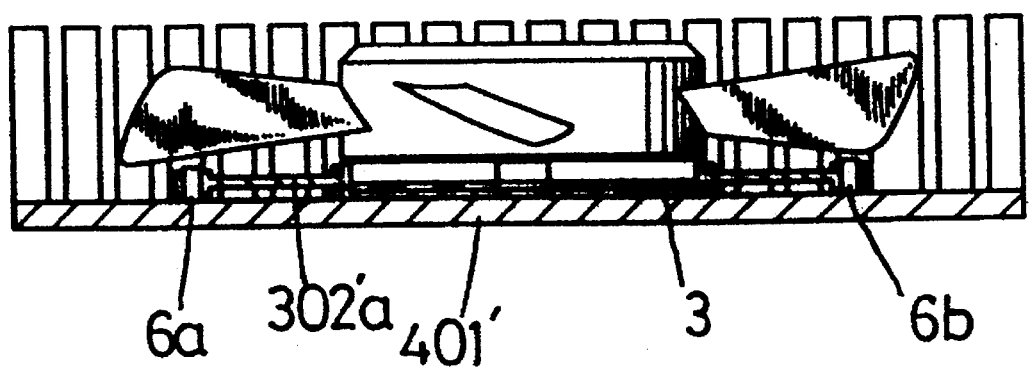
FIG. 5 is a front side view in section of the alternate form of FIG. 4 when assembled.

FIGS. 4 and 5 show an alternate form of the present invention. The lugs 302'a, 302'b, 302'c, 302'd of the heat-resisting plastic mount 3' have a respective pin hole 3021'a, 3021'b, 3021'c, 3021'd. The heat sink 4' comprises a plurality of projecting blocks 402'a, 402'b, 402'c, ... raised from the flat base 401' and defining a circular space for holding the heat-resisting plastic mount 3', and a plurality of upright pins 6a, 6b, 6c, 6d, which fit into the pin holes 3021'a, 3021'b, 3021'c, 3021'd on the lugs 302'a, 302'b, 302'c, 302'd of the heat-resisting plastic mount 3' when the heat-resisting plastic mount 3' is mounted within the circular space surrounded by the projecting blocks 402'a, 402'b, 402'c, . . .

What is claimed is:

1. A CPU cooling fan mounting structure comprising a motor-driven cooling fan, a heat-resisting plastic mount, and a heat sink fixed to a CPU (central processing unit), said heat sink having a mounting hole in a base plate thereof, which receives said heat-resisting plastic mount, said heat-resisting plastic mount fitting said mounting hole and being coupled to one end of said motor-driven cooling fan, the size of said heat-resisting plastic mount being slightly bigger than said mounting hole so that said heat-resisting plastic mount is firmly retained to said base plate of said heat sink when said heat-resisting plastic mount is fitted into said mounting hole.

2. The CPU cooling fan mounting structure of claim 1 wherein said heat-resisting plastic mount comprises a flange around the border defining a receiving chamber, which couples said one end of said motor-driven cooling fan, at least one lug radially extended from said flange, and a wire groove, which carries the electric wire of said motor-driven cooling fan; said mounting hole of said heat sink receives said flange and said at least one lug of said heat-resisting plastic mount.

3. The CPU cooling fan mounting structure of claim 1 wherein said flange of said heat-resisting plastic mount is a broken flange comprised of a plurality of flange segments.

* * * * *